United States Patent
Sano

(10) Patent No.: US 10,892,382 B2
(45) Date of Patent: Jan. 12, 2021

(54) SEMICONDUCTOR LIGHT-EMITTING ELEMENT

(71) Applicant: NICHIA CORPORATION, Anan (JP)

(72) Inventor: Masahiko Sano, Anan (JP)

(73) Assignee: NICHIA CORPORATION, Anan (JP)

(*) Notice: Subject to any disclaimer, the term of this patent is extended or adjusted under 35 U.S.C. 154(b) by 209 days.

(21) Appl. No.: 15/378,935

(22) Filed: Dec. 14, 2016

(65) Prior Publication Data
US 2017/0092812 A1   Mar. 30, 2017

Related U.S. Application Data

(62) Division of application No. 14/869,277, filed on Sep. 29, 2015, now Pat. No. 9,553,240.

(30) Foreign Application Priority Data

Sep. 30, 2014  (JP) ................. 2014-201775

(51) Int. Cl.
*H01L 33/06* (2010.01)
*H01L 33/20* (2010.01)
(Continued)

(52) U.S. Cl.
CPC ............. *H01L 33/38* (2013.01); *H01L 33/32* (2013.01); *H01L 33/42* (2013.01);
(Continued)

(58) Field of Classification Search
CPC ............. H01L 33/0016; H01L 33/0075; H01L 33/0079; H01L 33/20; H01L 33/22;
(Continued)

(56) References Cited

U.S. PATENT DOCUMENTS 6,657,236 B1 * 12/2003 Thibeault ............... H01L 33/20
257/81
2004/0135166 A1    7/2004 Yamada et al.
(Continued)

FOREIGN PATENT DOCUMENTS

JP   2004-146541 A   5/2004
JP   2006-156590 A   6/2006
(Continued)

OTHER PUBLICATIONS

Non-Final Office Action issued in U.S. Appl. No. 14/869,277 dated Jun. 7, 2016.
(Continued)

*Primary Examiner* — Mary A Wilczewski
(74) *Attorney, Agent, or Firm* — Foley & Lardner LLP

(57) ABSTRACT

A semiconductor light-emitting element includes a first semiconductor layer of a first conductive type, a second semiconductor layer of a second conductive type, a light-emitting layer formed between the first semiconductor layer and the second semiconductor layer, a first electrode connected to the first semiconductor layer, and a second electrode connected to the second semiconductor layer. The second electrode includes an ohmic electrode contacting the second semiconductor layer, and a semiconductor electrode made of a semiconductor layer contacting the ohmic electrode.

29 Claims, 6 Drawing Sheets

(51) Int. Cl.
    *H01L 33/32*          (2010.01)
    *H01L 33/38*          (2010.01)
    *H01L 33/42*          (2010.01)
    *H01L 33/40*          (2010.01)
    *H01L 33/00*          (2010.01)
    *H01L 33/22*          (2010.01)

(52) U.S. Cl.
    CPC .......... *H01L 33/0016* (2013.01); *H01L 33/20* (2013.01); *H01L 33/22* (2013.01); *H01L 33/40* (2013.01); *H01L 2933/0016* (2013.01)

(58) Field of Classification Search
    CPC ......... H01L 33/32; H01L 33/38; H01L 33/40; H01L 33/42; H01L 2933/0016
    See application file for complete search history.

(56) References Cited

U.S. PATENT DOCUMENTS

| | | | |
|---|---|---|---|
| 2005/0212002 A1* | 9/2005 | Sanga | H01L 33/20 257/96 |
| 2005/0230701 A1* | 10/2005 | Huang | H01L 33/14 257/103 |
| 2006/0267026 A1* | 11/2006 | Kim | H01L 25/0756 257/79 |
| 2008/0179608 A1 | 7/2008 | Ogawa et al. | |
| 2008/0241526 A1* | 10/2008 | Ou | H01L 33/42 428/336 |
| 2008/0258133 A1 | 10/2008 | Seong | |
| 2008/0296595 A1 | 12/2008 | Chu | |
| 2009/0272989 A1 | 11/2009 | Shum et al. | |
| 2010/0032691 A1 | 2/2010 | Kim | |
| 2010/0221897 A1 | 9/2010 | Seong | |
| 2010/0252103 A1* | 10/2010 | Yao | H01L 25/0756 136/256 |
| 2011/0095260 A1* | 4/2011 | Kim | H01L 27/156 257/13 |
| 2011/0133243 A1 | 6/2011 | Song | |
| 2011/0198560 A1* | 8/2011 | Okagawa | C23C 16/0236 257/13 |
| 2011/0244611 A1 | 10/2011 | Kim | |
| 2012/0012884 A1* | 1/2012 | Muramoto | H01L 33/06 257/99 |
| 2012/0043524 A1* | 2/2012 | Tanaka | H01L 33/42 257/13 |
| 2012/0104354 A1* | 5/2012 | Tanaka | H01L 33/42 257/9 |
| 2012/0273814 A1* | 11/2012 | Pan | H01L 33/145 257/88 |
| 2012/0305954 A1 | 12/2012 | Kim | |
| 2013/0009167 A1* | 1/2013 | Tan | H01L 33/44 257/77 |
| 2013/0056785 A1* | 3/2013 | Hwang | H01L 27/15 257/99 |
| 2013/0277692 A1 | 10/2013 | Chang et al. | |
| 2013/0292714 A1 | 11/2013 | Kim | |
| 2014/0239340 A1* | 8/2014 | Fujimori | H01L 33/40 257/99 |

FOREIGN PATENT DOCUMENTS

| | | |
|---|---|---|
| JP | 2008-187033 A | 8/2008 |
| JP | 2008-135554 A | 12/2008 |
| JP | 2009-514209 A | 4/2009 |
| JP | 2010-041057 A | 2/2010 |

OTHER PUBLICATIONS

Notice of Allowance issued in U.S. Appl. No. 14/869,277 dated Sep. 28, 2016.

* cited by examiner

SEMICONDUCTOR LIGHT-EMITTING ELEMENT

CROSS-REFERENCE TO RELATED APPLICATIONS

This application is a divisional of U.S. patent application Ser. No. 14/869,277, filed on Sep. 29, 2015, which claims priority to Japanese Patent Application No. 2014-201775, filed on Sep. 30, 2014, the entire disclosures of which are incorporated herein by reference.

TECHNICAL FIELD

The present disclosure relates to a semiconductor light-emitting element.

BACKGROUND

Light-emitting elements, in which nitride semiconductors are used, can emit light from near ultraviolet to red regions by virtue of the wide bandgap properties thereof, and accordingly, a variety of research on these light-emitting elements has been conducted. The general structure of a nitride semiconductor light-emitting element includes a semiconductor laminated structure, in which an n-type nitride semiconductor layer, an active layer, and a p-type nitride semiconductor layer are laminated on a substrate. Typically, an electrode is provided on approximately the entire surface of the p-type nitride semiconductor layer.

In some types of nitride semiconductor light-emitting elements, a light transmissive electrode made of a metal oxide, such as indium tin oxide (ITO), is employed as the electrode that is provided on approximately the entire surface of the p-type nitride semiconductor layer, and light is emitted through the light transmissive electrode. The light transmissive electrodes made of ITO and the like have high resistivity compared with metal electrodes, such that the light transmissive electrodes must be increased in thickness to obtain sufficient current diffusibility. However, an increase in the thickness of the light transmissive electrodes may lead to an increase in the light absorbed by the light transmissive electrodes. In order to solve the aforementioned problems, Patent Literature 1 (Japanese Unexamined Patent Application Publication No. 2006-156590) discloses that a current diffusion layer made of metallic materials is further provided between the p-type nitride semiconductor layer and the light transmissive electrodes so as to compensate for the current diffusibility of the light transmissive electrodes, thereby reducing the thickness of the light transmissive electrodes.

However, while the amount is small, absorption of light occurs in a light transmissive electrode made of a metal oxide such, as ITO. Accordingly, a further increase in the light output of the semiconductor light-emitting element and the suppression of the absorption of light by the electrodes is desired.

It is an object of certain embodiments of the present invention to provide a semiconductor light-emitting element that suppresses the absorption of light by an electrode and realizes a further increase in optical output.

SUMMARY

A semiconductor light-emitting element according to an embodiment of the present invention may include a first semiconductor layer of a first conductive type, a second semiconductor layer of a second conductive type, a light-emitting layer formed between the first semiconductor layer and the second semiconductor layer, a first electrode connected to the first semiconductor layer, and a second electrode connected to the second semiconductor layer. The second electrode further including a light-transmissive connection electrode in contact with the second semiconductor layer; and a light-transmissive semiconductor electrode made of a semiconductor layer, and in contact with the connection electrode.

According to the embodiment of the present invention provided above, the semiconductor light-emitting element that includes the semiconductor electrode made up of the semiconductor suppresses the absorption of light by the electrode can be suppressed, and an increase in output can be realized.

DETAILED DESCRIPTION OF EMBODIMENTS

Figure 1:
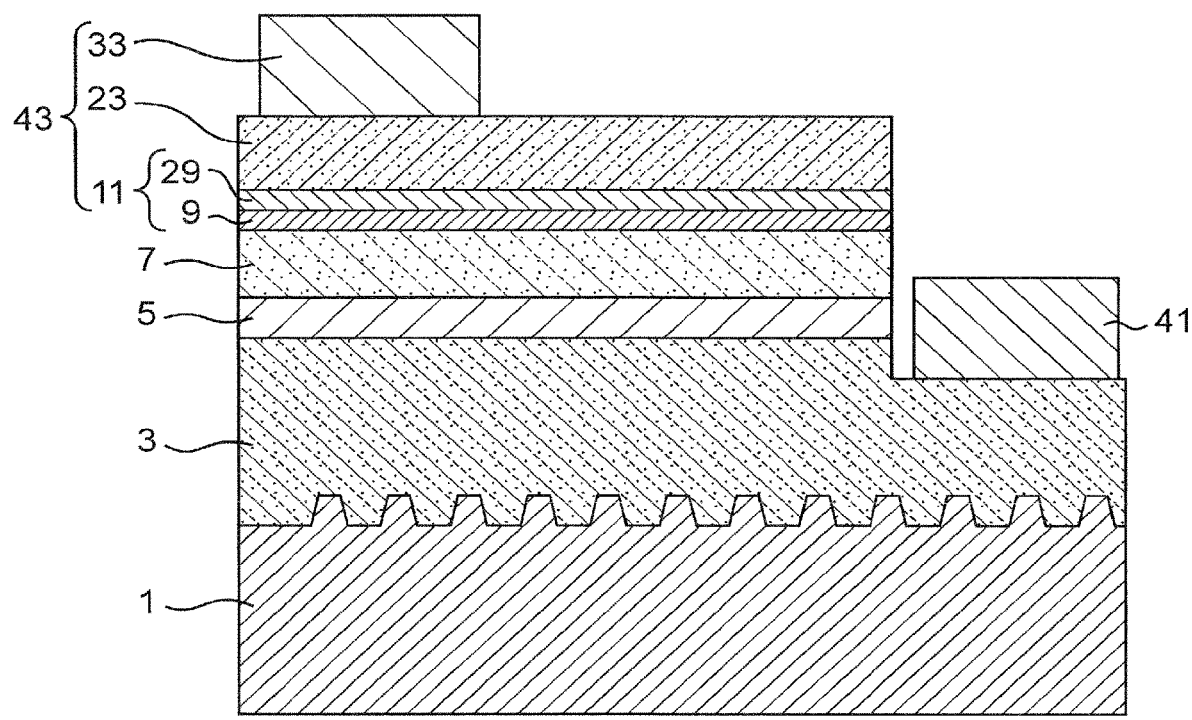
FIG. 1 is a schematic cross-sectional view illustrating a semiconductor light-emitting element according to an embodiment of the present invention.

The present embodiment allows the sheet resistance of a semiconductor layer having high resistivity, compared with metal electrodes, to be equalized with that of the metal electrodes by increasing the thickness of the semiconductor layer.

Theoretical Considerations

A comparison of current diffusing performance in terms of the resistivity of conventional electrodes made of indium tin oxide (ITO) or Ag, and an electrode made of an n-type gallium nitride (n-GaN) is presented in Table 1 below.

TABLE 1

| Material | Resistivity ($10^{-8}$ Ωm) |
|---|---|
| ITO | 150 |
| n-GaN | 4700 |
| Ag | 1.58 |

As shown in Table 1, the resistivity of the n-type gallium nitride (n-GaN) is 1,000, or more, times that of the metal, such as Ag, and 10, or more, times that of a conventional light transmissive electrode, such as ITO. However, the resistivity can be reduced by increasing the thickness, so that an increase in the thickness of an n-GaN layer that is used as an electrode layer can increase the sheet resistance to the same degree to that of the metal, such as Ag, or metal oxide, such as ITO. For example, an Ag electrode used as a light transmissive electrode is formed in a thickness of approximately 20 Å to ensure its light transmissive property while providing current diffusion. A sheet resistance equivalent to that of the Ag electrode with a thickness of approximately 20 Å can be realized with an n-GaN layer with a thickness of 6 μm, as shown in Table 3 below. It is not difficult to form the nitride semiconductor layer as an element of the semiconductor light-emitting element having a thickness of several μm to several tens of μm, so that the semiconductor layer, such as the n-GaN layer, can be utilized as the electrode.

The conventional ITO, the conventional Ag, and the n-type gallium nitride (n-GaN) are compared in terms of optical constants in Table 2.

TABLE 2

| | Optical Properties | | |
|---|---|---|---|
| Material | λ (nm) | n | k |
| ITO | 460 | 2.000 | 0.01 |
| n-GaN | 460 | 2.450 | 0.00001 |
| Ag | 460 | 0.151 | 2.472 |

In Table 2, n and k represent a real part of a refractive index and an imaginary part of the refractive index, respectively, in a complex refractive index N given by expression (1) below. The complex refractive index N is defined by a ratio of a light velocity c in vacuum to a light velocity v in a medium.

$$N = n - ik \quad (1)$$

Herein, i represents an imaginary number, and $i^2 = -1$.

Further, the real part n of the refractive index is generally referred to simply as the refractive index, and the imaginary part k of the refractive index is a value associated with absorption of light, which is involved with an absorption coefficient α given by expression (2).

$$\alpha = 4\pi k/\lambda \quad (2)$$

Herein, α represents an inverse number of a propagation distance, which is obtained by reducing the intensity of incident light to the intensity of 1/e, and λ represents the wavelength of light. Further, when the light advances by a distance d in a film having the absorption coefficient α, transmissivity T is given by expression (3).

$$T = \exp(-\alpha d) \quad (3)$$

The light absorptivity of the n-type gallium nitride (n-GaN) is extremely low, compared with the conventional light transmissive electrodes, such as ITO. Thus, an electrode with sufficiently small light absorptivity can be realized even in the case where the thickness of an n-type gallium nitride (n-GaN) layer is increased.

Accordingly, in a case where each thickness is set in such a manner as to obtain the same sheet resistance, the sheet resistivity and the absorption of light are calculated as shown in Table 3.

TABLE 3

| Material | Sheet Resistance (Ω/Square) | Film Thickness (Å) | Absorption (Vertical Incidence) (%) |
|---|---|---|---|
| ITO | 7.8 | 1930 | 5.13 |
| n-GaN | 7.8 | 60000 | 0.16 |
| Ag | 7.8 | 20.2 | 12.74 |

As shown in Table 3, the use of an n-type gallium nitride semiconductor layer made of n-GaN, with a thickness of about 6 μm (60,000 Å) in place of an ITO electrode with a thickness of about 0.2 μm (1,930 Å) as the electrode produces a light transmissive electrode which has a sheet resistance approximately equal to the sheet resistance of the ITO electrode and an extremely low light absorptivity.

As is described above, the thickness of the semiconductor layer made of the n-type gallium nitride (n-GaN) is set in such a manner as to obtain a desired resistance value, which allows the semiconductor layer to be utilized as the semiconductor electrode. Furthermore, instead of using only the conventional light transmissive electrode such as ITO, utilizing the semiconductor electrode can produce a light transmissive electrode having a resistance equivalent to that of conventional electrodes while having an extremely small absorption of light compared with that of the conventional electrodes. Certain embodiments of the present invention has been made in view of the aforementioned theoretical considerations. Hereinafter, the semiconductor light-emitting element of embodiments according to the present invention will be described.

Semiconducting Light-Emitting Element

A semiconductor light-emitting element of an embodiment according to the present invention is a semiconductor light-emitting element that includes a semiconductor electrode made of an n-type nitride semiconductor, and that emits light via the semiconductor electrode.

As illustrated in FIG. 1, light emitting elements according to an embodiment of the present invention include a substrate 1, a first conductive-type semiconductor layer 3 on the substrate 1, a light emitting layer 5 disposed on the first conductive-type semiconductor layer 3, a second conductive-type semiconductor layer 7 disposed on the light emitting layer 5, a first electrode (i.e. first pad electrode) 41 connected to the first conductive-type semiconductor layer 3, and a second electrode 43 connected to the second conductive-type semiconductor layer 7. The substrate 1 may include sapphire. The first conductive-type semiconductor layer 3 may include an n-type semiconductor. The light emitting layer 5 may include a nitride semiconductor that contains In. The second conductive-type semiconductor layer 7 may include a p-type nitride semiconductor. Moreover, the second electrode 43 includes a connection electrode 11 provided on approximately the whole of the upper surface of the second conductive-type semiconductor layer 7, a semiconductor electrode 23, and a second pad electrode 33 provided on a portion of the upper surface of the semiconductor electrode 23. The connection electrode 11 may include ITO, and the semiconductor electrode 23 may include n-type GaN.

The connection electrode 11 may be a bonded body including a first ohmic electrode 9 and a second ohmic electrode 29.

Examples of specific materials that can be used for each member of semiconducting light-emitting element include:
for the first conductive-type semiconductor layer 3: n-GaN;
for the light emitting layer 5: InGaN, InAlGaN;
for the second conductive-type semiconductor layer 7: p-GaN;
for the first ohmic electrode 9: at least one of ITO, Ag, Ti, and Ni,
for the second ohmic electrode 29: at least one of ITO, Ag, Ti, and Al;
for the semiconductor electrode 23: at least one of n-GaN and n-AlGaN; and
for the first pad electrode 41 and the second pad electrode 33: Ti/Al/Ti/Pt/Au (i.e. a stacked body of Ti, Al, Ti, Pt, and Au).

Herein, ITO, Ag, Ti, and Ni, as the first ohmic electrode 9, can be connected to the p-type nitride semiconductor layer with a low contact resistance, for example, through ohmic contact in the case of forming the second conductive-type semiconductor layer 7 of a p-type nitride semiconductor layer, such as p-GaN and the like. Similarly, ITO, Ag, Ti, and Al, as the second ohmic electrode 29, can be connected to the n-type nitride semiconductor layer with low contact resistance, for example, through ohmic contact when the semiconductor electrode 23 formed of the n-type nitride semiconductor layer, such as n-GaN, n-AlGaN, or the like.

The thicknesses of the first ohmic electrode 9 and the second ohmic electrode 29 may differ depending on the materials constituting each ohmic electrode. For example, in the case of forming the first ohmic electrode 9 or the second ohmic electrode 29 from a metal such as Ag, Ti, or Ni, the thickness can be 0.1 nm to 0.8 nm, preferably 0.1 nm to 0.4 nm, and more preferably 0.1 nm to 0.2 nm. Similarly, in the case of forming the first ohmic electrode 9 or the second ohmic electrode 29 from a metal oxide such as ITO, the thickness can be 1 nm to 100 nm, preferably from 1 nm to 50 nm, and more preferably from 1 nm to 30 nm. Ohmic contact properties can be maintained with a thickness equal to or greater than a certain thickness, and the absorption of light by the first ohmic electrode 9 can be reduced with a thickness equal to or smaller than a certain thickness. Although the thicknesses of the first ohmic electrode 9 and the second ohmic electrode 29 can be the same, it is preferable that the thickness of the first ohmic electrode 9 is larger than that of the second ohmic electrode 29. Generally, a number of protrusions are present on the surface of the p-type nitride semiconductor layer, which makes it difficult to obtain a flat surface on the first ohmic electrode 9. However, by increasing the thickness of the first ohmic electrode 9, a flat surface can be obtained on the first ohmic electrode 9.

In the semiconductor light-emitting element configured as described above, the connection electrode 11 is made of a metal oxide, such as ITO, or a metal, such as Ag, and bonded to the second conductive-type semiconductor layer 7 and the semiconductor electrode 23 to secure good electrical conduction between the second conductive-type semiconductor layer 7 and the semiconductor electrode 23. That is, if the second conductive-type semiconductor layer 7 and the semiconductor electrode 23 are directly bonded, good electrical conduction may be difficult to establish due to formation of PN junctions and the like. Accordingly, in the present embodiment, good electrical conduction between the second conductive-type semiconductor layer 7 and the semiconductor electrode 23 is secured by providing the connection electrode 11 that makes an ohmic contact to both the second conductive-type semiconductor layer 7 and the semiconductor electrode 23. Furthermore, in the semiconductor light-emitting light is emitted via the semiconductor electrode 23 with the use of the light transmissive property of the semiconductor electrode 23, such that the connection electrode 11 is provided by, for example, a light transmissive electrode member, such as ITO.

The connection electrode 11 is configured to bond to the second conductive-type semiconductor layer 7 and the semiconductor electrode 23, while also securing good electrical conduction between the second conductive-type semiconductor layer 7 and the semiconductor electrode 23. The semiconductor electrode 23 serves to diffuse the current applied via the second pad electrode 33. Accordingly, the connection electrode 11 can be formed with a small thickness compared with conventional electrodes used for diffusing the current. For example, in the semiconductor light-emitting element of the present embodiment, in which the light is emitted via the semiconductor electrode 23, the connection electrode 11 can be formed with a small thickness compared with conventional light transmissive electrodes, such as ITO, used for current diffusion, and the absorption of light by the connection electrode 11 can be reduced significantly as a result. Further, in the semiconductor light-emitting element of the present embodiment, as described above, even when the thickness of the semiconductor electrode 23 used for current diffusion is increased in such a manner as to obtain the sheet resistance that produces effective diffusion of the current, the absorption of light can be sufficiently reduced. Accordingly, in the semiconductor light-emitting element of the present embodiment, the semiconductor electrode 23 has a light transmissive property and is used for current diffusion. Thus, an electrode structure with a low resistivity and substantially no light-absorption can be produced. Thus, a semiconductor light-emitting element that has a high light-extraction efficiency, a high light-emitting efficiency, and a low driving voltage can be provided.

The semiconductor electrode 23 can have a thickness of 2 μm to 200 μm, preferably 3 μm to 20 μm, and more preferably 4 μm to 10 μm. As described above, when the semiconductor electrode 23 is above a certain thickness, the resistivity can be reduced, such that the current can be efficiently applied. Also, when the semiconductor electrode 23 is below a certain thickness, influence of a warpage caused by the difference in thermal expansion between the semiconductor electrode and a growth substrate during the manufacture of the semiconductor electrode can be reduced, such that an improvement in a process yield rate can be expected.

Subsequently, a method of manufacturing a semiconductor light-emitting element of the present embodiment will be described. The method of manufacturing a semiconductor light-emitting element of the present embodiment includes forming a semiconductor electrode, forming a semiconductor stacked-layer structure, and forming an electrode structure. The step of forming a semiconductor electrode and the step of forming a semiconductor stacked-layer structure can be performed in parallel, and the step of forming an electrode structure is performed after the step of forming a semiconductor electrode and the step of forming a semiconductor stacked-layer structure.

Forming Semiconductor Electrode

Figure 2A:
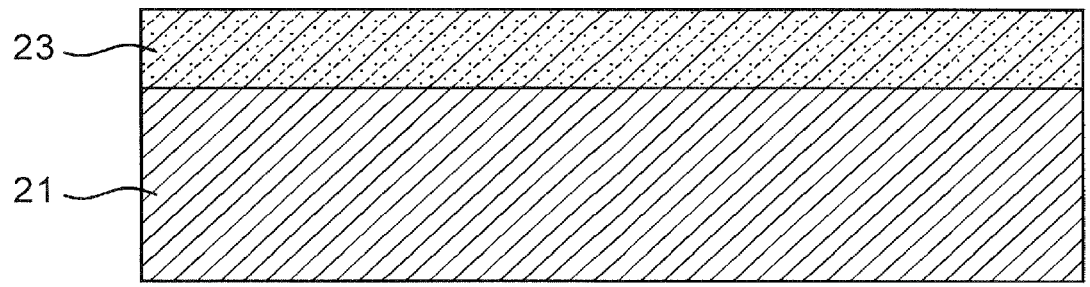
FIG. 2A is a schematic cross-sectional view illustrating a structure produced by a step in a manufacturing method of the semiconductor light-emitting element of FIG. 1 in which a semiconductor electrode is grown on a growth substrate.

In the present method of manufacturing, as illustrated in FIG. 2A, first, the semiconductor electrode 23 made of the nitride semiconductor, such as n-type GaN, is grown on a growth substrate 21, such as sapphire. The semiconductor electrode may be grown via a buffer layer. In the semiconductor light-emitting element according to the present embodiment that is configured to emit light through the semiconductor electrode 23, a semiconductor material which has a bandgap greater than that of the semiconductor material which constitutes the light emitting layer is selected for a semiconductor material to constitute the semiconductor electrode 23. In the case of employing a multiple quantum well structure made of well layers and barrier layers for the light emitting layer, a semiconductor material which has a bandgap greater than that of the well layers is selected. Further, a semiconductor material that can obtain a low resistivity by addition of dopant may be selected. For example, in a nitride semiconductor light-emitting element, in the case where a nitride semiconductor that contains indium is used as the light emitting layer, a n-type GaN or a n-type AlGaN doped with silicon or germanium can be selected as the semiconductor material for the semiconductor electrode 23. In the case of the n-type GaN, it is preferable that the concentration of the dopant be increased to an extent that does not impair crystallinity, and thus the concentration of the dopant can be, for example, $1\times10^{18}/cm^3$ to $1\times10^{19}/cm^3$. In the case of the n-type AlGaN, the concentration of the dopant can be, for example, $1\times10^{18}/cm^3$ to $1\times10^{19}/cm^3$. Further, a n-type GaN can be grown to a large thickness with good crystallinity, such that it can be used as a preferable material for a nitride semiconductor light-emitting element that emits a visible light, such as a blue light. Also, n-type AlGaN has a bandgap larger than that of GaN, and absorption of ultraviolet rays can be reduced with an increase in the ratio of Al, such that the n-type AlGaN can be used as a preferable material for a nitride semiconductor light-emitting element that emits ultraviolet rays. The mixed crystal ratio of Al in the n-type AlGaN can be, in the case of assuming AlxGa1−xN (1>x>0), can be 0.02≤x≤0.1, preferably, 0.02≤x≤0.06.

Figure 2B:
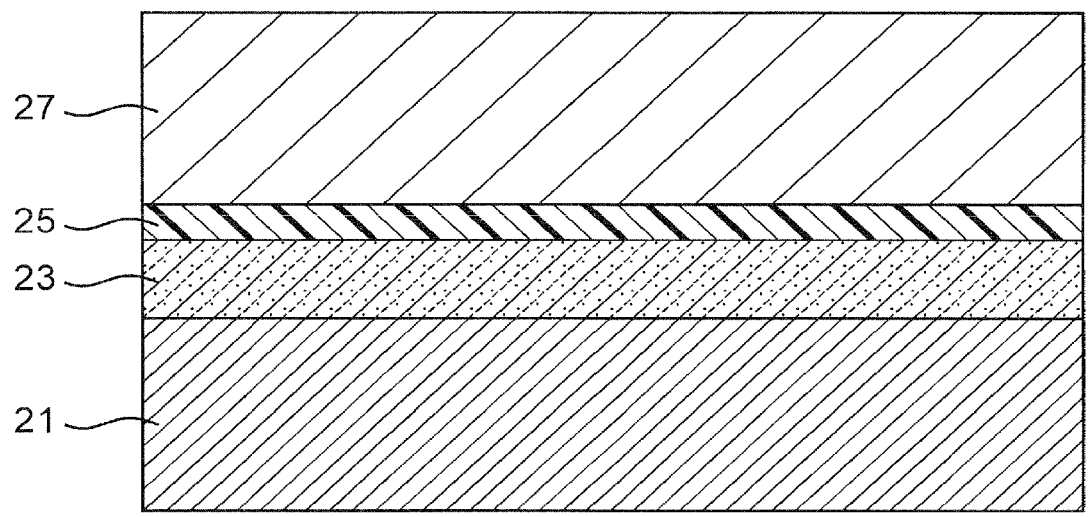
FIG. 2B is a schematic cross-sectional view illustrating a structure produced by a step in a manufacturing method of the semiconductor light-emitting element of FIG. 1 in which an adhesive layer is formed on the upper surface of the semiconductor electrode of FIG. 2A, and bonded to a supporting substrate.
Figure 2C:
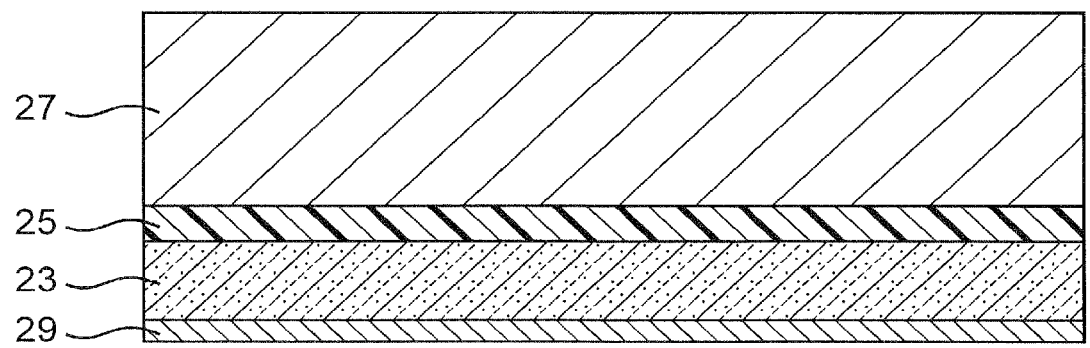
FIG. 2C is a schematic cross-sectional view illustrating a structure produced by a step in a manufacturing method of the semiconductor light-emitting element of FIG. 1 in which the growth substrate of FIG. 2B is removed, and a second ohmic electrode is formed on the surface of the semiconductor electrode exposed due to the removal of the growth substrate.

Subsequently, as illustrated in FIG. 2B, on the upper surface of the semiconductor electrode 23, an adhesive layer 25 is formed, and a supporting substrate 27 is bonded to the adhesive layer 25. The adhesive layer 25 may be formed of an adhesive resin, such as a thermosetting resin. The supporting substrate 27 may include sapphire. Subsequently, as illustrated in FIG. 2C, the growth substrate 21 is removed by using a laser lift-off method, or the like. More specifically, a laser beam of a wavelength which allows the laser beam to penetrate the growth substrate 21 and is absorbed by the semiconductor material constituting the semiconductor electrode 23 is selected. The laser beam is emitted from the growth substrate 21 side to rise a temperature in the vicinity of the interface between the growth substrate 21 and the semiconductor electrode 23 to ablate (degrade) the adhesive layer 25, thereby removing the growth substrate 21.

After the removal of the growth substrate 21, the surface of the semiconductor electrode 23 is polished by a chemical mechanical polishing method, or the like, to obtain a smooth surface of the semiconductor electrode 23. Then, as illustrated in FIG. 2C, a second ohmic electrode 29 is formed on the surface of the semiconductor electrode 23 that is exposed by removing the growth substrate 21. The second ohmic electrode 29 may be made of, for example, a metal oxide, such as ITO, or a metal, such as Ag.

Forming Semiconductor Stacked-Layer Structure

Figure 2D:
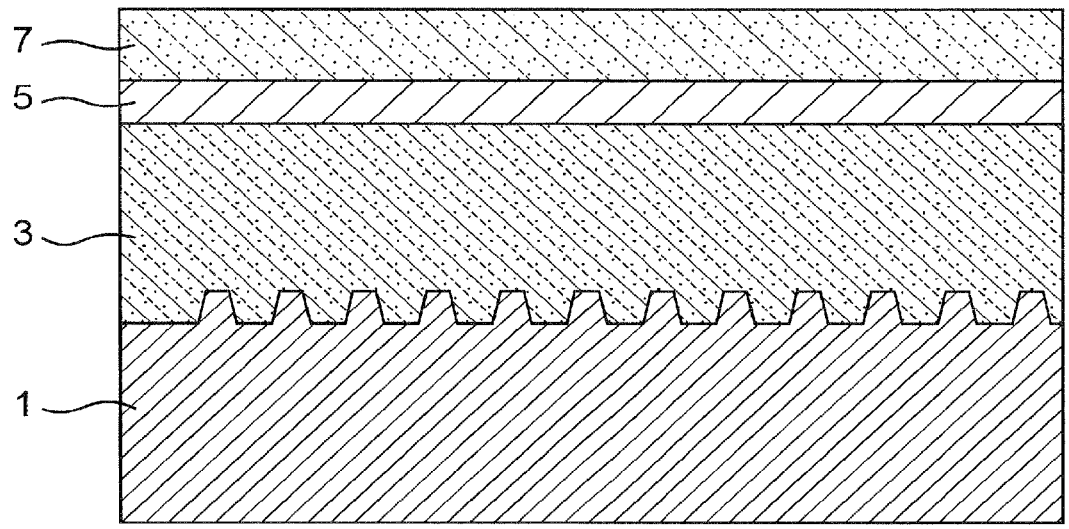
FIG. 2D is a schematic cross-sectional view illustrating a structure produced by a step in a manufacturing method of the semiconductor light-emitting element of FIG. 1 in which a first conductive-type semiconductor layer, a light emitting layer, and a second conductive-type semiconductor layer are grown on the surface of a substrate.

In the step of forming a semiconductor stacked layer structure, first, a substrate 1 is provided. The substrate 1 may include sapphire. Subsequently, as illustrated in FIG. 2D, a surface of the substrate 1 for growing a semiconductor layer is processed to form recesses/protrusions. The processing of the surface of the substrate 1 to form recesses/protrusions is optional. The surface processing can be performed by setting the conditions on the shape and the dimensions of a mask and the conditions of etching, according to the crystal form of the substrate and the plane orientation of the surface of the substrate on which the recesses/protrusions are to be formed, so as to obtain a target surface geometry.

For example, in the case of forming a circular mask on a surface of a C-plane of a sapphire substrate and etching the substrate, in an early stage of etching, portions which are not provided with the mask are removed by the etching, and circular protrusions approximately corresponding to the shape of the mask are formed. Then, as the etching progresses, due to the influence of directional dependency in the etching rate attributed to crystal forms (the progress of etching differs depending on the direction of crystal orientation) the circular protrusions are formed into shapes reflected on the crystal forms. The formation of the protrusions allows the growth of the semiconductor layer with good crystallinity and good light-extraction efficiency.

Figure 2E:
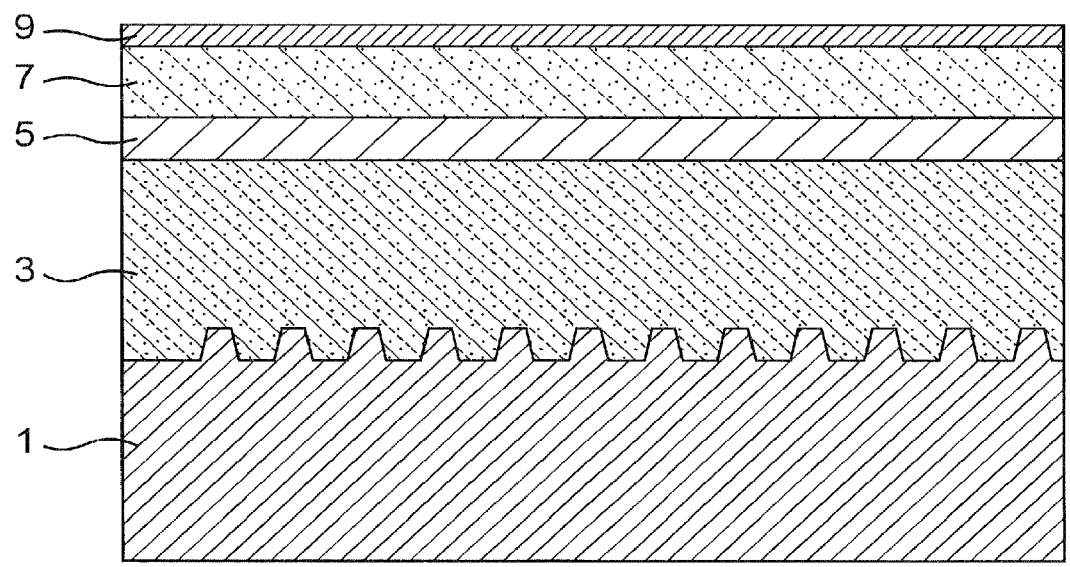
FIG. 2E is a schematic cross-sectional view illustrating a structure produced by a step in a manufacturing method of the semiconductor light-emitting element of FIG. 1 in which a first ohmic electrode is formed on the upper surface of the second conductive-type semiconductor layer of FIG. 2D.

Subsequently, as illustrated in FIG. 2D, a first conductive-type semiconductor layer 3, a light emitting layer 5, and a second conductive-type semiconductor layer 7 are grown on the treated surface of the substrate 1, thereby manufacturing the semiconductor stacked-layer structure. The semiconductor layer 3 may include an n-type semiconductor. The light emitting layer 5 may include a nitride semiconductor which contains indium. The second conductive-type semiconductor layer 7 may include a p-type nitride semiconductor. Furthermore, as illustrated in FIG. 2E, a first ohmic electrode 9 is formed on the entire upper surface of the second conductive-type semiconductor layer 7. The first ohmic electrode 9 may include ITO.

After the formation of the first ohmic electrode 9, the surface of the first ohmic electrode 9 may be planarized by a known method, such as Chemical Mechanical Polishing (CMP). At the time of growing the semiconductor layer, irregularities may be formed on the surface of the p-type nitride semiconductor layer. Subsequently, irregularities may be generated on the surface of the first ohmic electrode 9, that may lead to difficulty in bonding with the second ohmic electrode 29. In such cases, planarizing the surface of the first ohmic electrode 9 can facilitate the bonding between the first ohmic electrode 9 and the second ohmic electrode 29.

Forming Electrode Structure

Figure 2F:
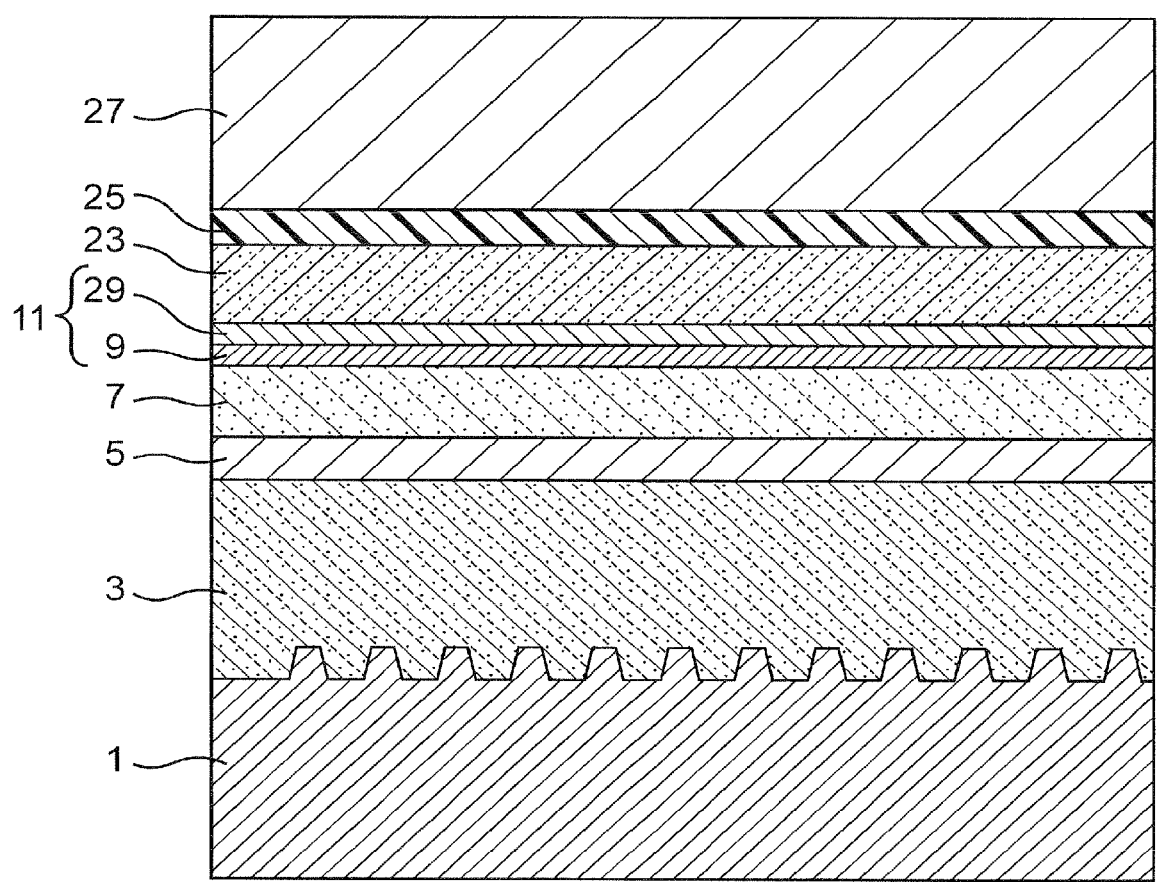
FIG. 2F is a schematic cross-sectional view illustrating a structure produced by a step in a manufacturing method of the semiconductor light-emitting element of FIG. 1 in which the first ohmic electrode of FIG. 2E and the second ohmic electrode of FIG. 2C are bonded to each other.

The first ohmic electrode 9 (as shown in FIG. 2E) formed on the entire upper surface of the second conductive-type semiconductor layer 7 having the semiconductor stacked-layer structure and the second ohmic electrode 29 (as shown in FIG. 2C) formed on the surface of the semiconductor electrode 23 supported by the supporting substrate 27 are bonded by using a room-temperature bonding method (as shown in FIG. 2F). In the present embodiment, a surface activation bonding method is used as the room-temperature bonding method. The surface activation bonding method is a method in which after a bonding interface is activated by applying ion beams or plasmas to the bonding surfaces, the members are directly bonded by contacting the activated surfaces thereof. According to the surface activation bonding method, materials can be bonded directly to each other without any intervening elements. In the present embodiment, the connection electrode 11, which is the bonding body of the first ohmic electrode 9 and the second ohmic electrode 29, is made of ITO.

In the present embodiment, the surface activation bonding method is used as the room-temperature bonding method, but an atomic diffusion bonding method can also be applied as a bonding method. Further, thermal compression or the like can also be used as the bonding method.

The atomic diffusion bonding method is a method in which superimposing thin layers of metal layers in vacuum generates atomic diffusion at the bonding interface and crystal grain boundary, which bonds the layers firmly to each other. Moreover, the atomic diffusion bonding method enables not only bonding between similar materials, for example bonding between metals, but also bonding between different materials, for example bonding between a metal and a semiconductor, between a metal oxide and a semiconductor, or bonding between a metal and a metal oxide. Furthermore, in the case of employing an atomic diffusion bonding method for the bonding, the thicknesses of the first ohmic electrode 9 and the second ohmic electrode 29 may be, for example, 20 nm or less. As described above, the thickness of the connection electrode 11 can be extremely small, so that the absorption of light by the connection electrode 11 can be reduced. In the case of bonding by an atomic diffusion bonding method, an atomic diffusion layer may be formed between the first ohmic electrode 9 and the second ohmic electrode 29. A bond of high uniformity can be easily realized by providing the atomic diffusion layer. The atomic diffusion layer between the first ohmic electrode 9 and the second ohmic electrode 29 is made of a metal, for example, Au, Ti, or the like. In this case, the atomic diffusion layer is formed with a small thickness to an extent such that light is not substantially absorbed by the atomic diffusion layer. The thickness of the atomic diffusion layer may depend on the material of the atomic diffusion layer. In the case of Au, the atomic diffusion layer may be formed with a thickness of, for example, 0.1 μm to 0.4 μm.

In the present embodiment, the semiconductor electrode 23 grown on the growth substrate 21 is bonded to the supporting substrate 27 before the step of forming the electrode structure. Due to the difference in thermal expansion between the semiconductor electrode and the growth substrate, during manufacturing, a semiconductor electrode may be projectingly warped to the semiconductor electrode side. However, such a warpage can be reduced by bonding the semiconductor electrode 23 to the supporting substrate 27, thus facilitating the bonding of the second ohmic electrode 29 provided on the semiconductor electrode to the first ohmic electrode 9 formed on the entire upper surface of the second conductive-type semiconductor layer 7 that has the semiconductor stacked-layer structure. The step of bonding the semiconductor electrode 23 to the supporting substrate 27 is optional, and the semiconductor electrode 23 grown on the growth substrate 21 can be provided directly to the next forming step. In this case, after the formation of the semiconductor electrode 23, the surface of the semiconductor electrode 23 is polished. In this manner, the step of bonding the semiconductor electrode 23 to the supporting substrate 27 is omitted, such that productivity can be improved.

Figure 2G:
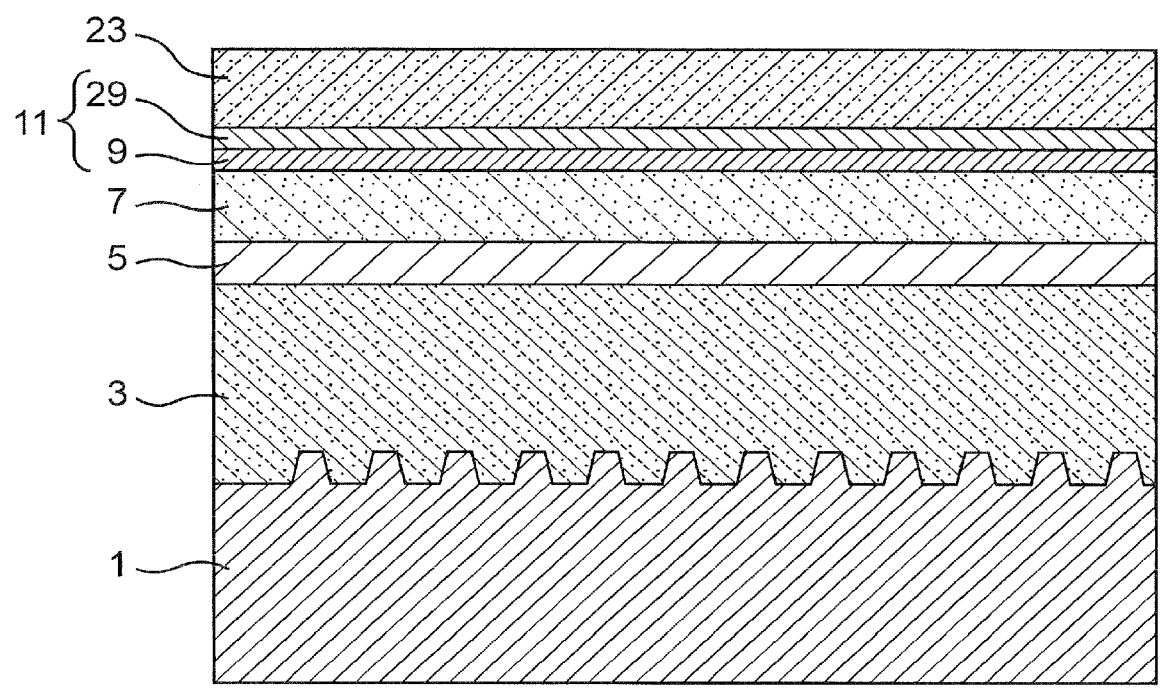
FIG. 2G is a schematic cross-sectional view illustrating a structure produced by a step in a manufacturing method of the semiconductor light-emitting element of FIG. 1 in which the adhesive layer and the supporting substrate of FIG. 2F are removed.

Subsequently, as illustrated in FIG. 2G, the adhesive layer 25 and the supporting substrate 27 are removed. More specifically, a laser beam of a wavelength which penetrates the supporting substrate 27 and is absorbed by the semiconductor material that constitutes the semiconductor electrode 23 is selected. Then, the laser beam is emitted from the supporting substrate 27 side to raise the temperature in the vicinity of the interface between the supporting substrate 27 and the adhesive layer 25 to ablate (degrade) the adhesive layer 25, thereby removing the supporting substrate 27. Subsequently, the adhesive layer 25 is removed by ashing with oxygen or by using a chemical solution such as sulfuric acid. In particular, with the use of a chemical solution such as sulfuric acid, damage on the semiconductor electrode 23 can be satisfactorily reduced.

After the adhesive layer 25 and the supporting substrate 27 are removed, portions of the semiconductor electrode 23, the second conductive-type semiconductor layer 7, and the light emitting layer 5 disposed on an electrode forming surface are removed in order to expose a portion of the first conductive-type semiconductor layer 3 (i.e. the electrode forming surface). Subsequently, a first electrode 41 is formed on the electrode forming surface of the first conductive-type semiconductor layer 3, and a second pad electrode 33 is formed on a portion of the surface of the semiconductor electrode 23. For example, the first electrode 41 and the second pad electrode 33 can be formed of stacked-layer bodies of the same configuration that includes Ti, Al, Ti, Pt, and Au, and may be formed in the same step.

As described above, the semiconductor light-emitting element illustrated in FIG. 1 according to the first embodiment is manufactured.

The aforementioned semiconductor light-emitting element of the present embodiment is configured to emit light through the semiconductor electrode 23. The semiconductor light-emitting element may be configured such that a light reflection layer made of a dielectric multilayer film is provided on the semiconductor electrode, and light is emitted from a light transmissive substrate 1, such as sapphire. Even in a case where the light is emitted from the substrate 1 side, absorption of the light by the electrode occurs at the time of extracting the light by reflecting the light that is propagating toward the electrode side, and according to the present embodiment, the absorption by the electrode can be reduced, such that the light emitting efficiency can be improved.

Figure 3:
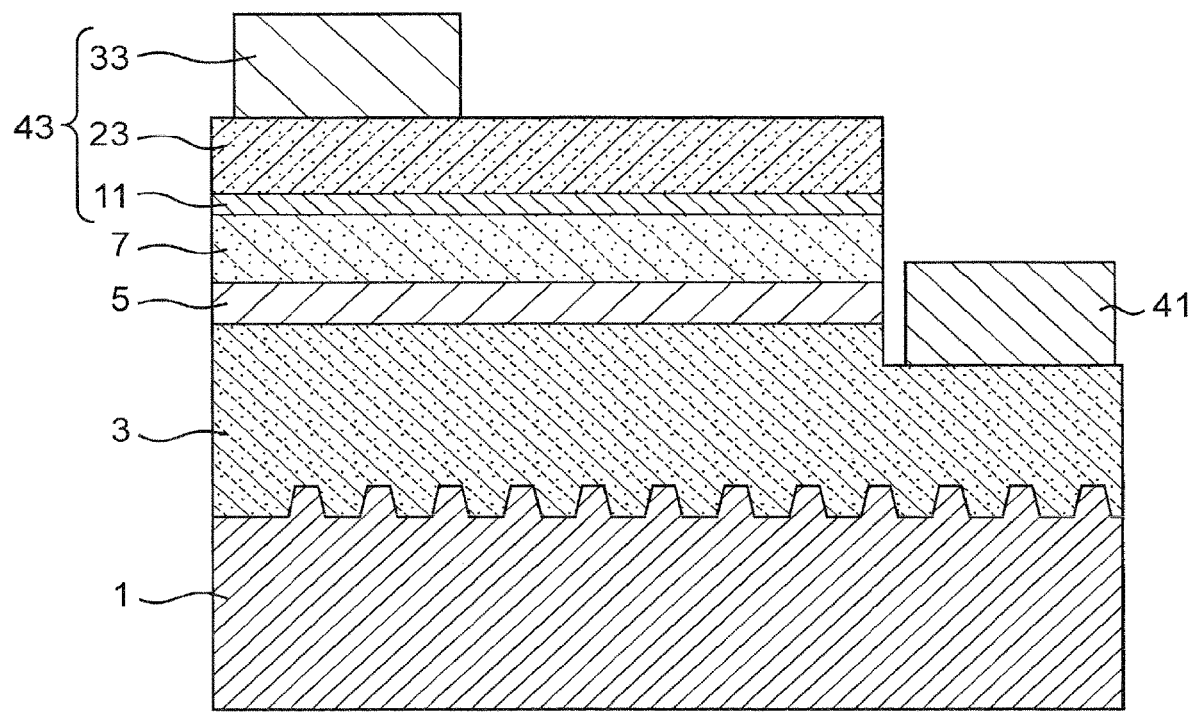
FIG. 3 is a schematic cross-sectional view illustrating a semiconductor light-emitting element according to a modified embodiment of the present invention.

In the semiconductor light-emitting element of the present embodiment, the first ohmic electrode 9 formed on the second conductive-type nitride semiconductor layer and the second ohmic electrode 29 formed on the semiconductor electrode 23 are bonded. However, as shown in FIG. 3, the semiconductor light-emitting element may be configured such that the connection electrode is formed on either the second conductive-type nitride semiconductor layer or the semiconductor electrode 23, and the connection electrode is directly connected to the other of the second conductive-type nitride semiconductor layer or the semiconductor electrode 23. Alternatively, after forming the connection electrode on the second conductive-type nitride semiconductor layer, the semiconductor electrode 23 may be directly formed on the connection electrode, such as by using a spattering method (e.g., an Electron Cyclotron Resonance (ECR) spattering method).

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed:

1. A semiconductor light-emitting element comprising:
a first semiconductor layer;
a second semiconductor layer;
a light-emitting layer formed between the first semiconductor layer and the second semiconductor layer;
a first electrode connected to the first semiconductor layer; and
a second electrode connected to the second semiconductor layer;
wherein the first electrode and the second electrode are formed on the same side of the semiconductor light-emitting element;
wherein the second electrode comprises:
a light-transmissive connection electrode in contact with the second semiconductor layer,
a light-transmissive semiconductor electrode in contact with the connection electrode, the light-transmissive semiconductor electrode being made of a semiconductor layer, and
a pad electrode in contact with a first portion of the uppermost surface of the light-transmissive semiconductor electrode, such that a second portion of the uppermost surface of the light-transmissive semiconductor electrode is exposed from the pad electrode; and
wherein the light-transmissive connection electrode is an ohmic electrode that includes:
a first ohmic electrode ohmically contacting the second semiconductor layer, and
a second ohmic electrode bonded to the first ohmic electrode by surface activation bonding or atomic diffusion bonding, and ohmically contacting the semiconductor electrode,
wherein both the first ohmic electrode and the second ohmic electrode are made of indium tin oxide.

2. The semiconductor light-emitting element according to claim 1,
wherein a thickness of the first ohmic electrode is greater than a thickness of the second ohmic electrode.

3. The semiconductor light-emitting element according to claim 1,
wherein the first semiconductor layer, the second semiconductor layer, and the semiconductor electrode each comprise a nitride semiconductor.

4. The semiconductor light-emitting element according to claim 3,
wherein the semiconductor electrode comprises GaN or AlGaN.

5. The semiconductor light-emitting element according to claim 4,
wherein the semiconductor electrode comprises GaN doped with an n-type impurity.

6. The semiconductor light-emitting element according to claim 5,
wherein a concentration of the n-type impurity of the semiconductor electrode is in a range of $1\times10^{18}/cm^3$ to $1\times10^{19}/cm^3$.

7. The semiconductor light-emitting element according to claim 1,
wherein a thickness of the semiconductor electrode is greater than a thickness of the light-transmissive connection electrode.

8. The semiconductor light-emitting element according to claim 1, wherein the semiconductor electrode has a thickness in a range of 2 μm to 200 μm.

9. The semiconductor light-emitting element according to claim 1,
wherein the semiconductor electrode has a thickness in a range of 4 μm to 10 μm.

10. The semiconductor light-emitting element according to claim 1,
wherein a thickness of the first ohmic electrode and a thickness of the second ohmic electrode is in a range of 1 nm to 30 nm.

11. The semiconductor light emitting element according to claim 1,
wherein the second ohmic electrode is bonded to the first ohmic electrode by atomic diffusion bonding, such that an atomic diffusion layer is located between the first ohmic electrode and the second ohmic electrode.

12. The semiconductor light-emitting element according to claim 11,
wherein the atomic diffusion layer is an Au layer.

13. The semiconductor light-emitting element according to claim 12,
wherein the Au layer has a thickness in a range of 0.1 μm to 0.4 μm.

14. The semiconductor light emitting element according to claim 1,
wherein the light-transmissive semiconductor electrode has a single planar uppermost surface that extends from a first overall end of the light-transmissive semiconductor electrode to a second overall end of the light-transmissive semiconductor electrode, and
wherein an end surface of the second semiconductor layer is flush with an end surface of the light-transmissive semiconductor electrode in a cross-sectional view of the semiconductor light-emitting element.

15. A semiconductor light-emitting element comprising:
a sapphire substrate;
a first semiconductor layer formed on the sapphire substrate;
a second semiconductor layer;
a light-emitting layer formed between the first semiconductor layer and the second semiconductor layer;
a first electrode connected to the first semiconductor layer; and
a second electrode connected to the second semiconductor layer,
wherein the second electrode comprises:
a light-transmissive connection electrode in contact with the second semiconductor layer,
a light-transmissive semiconductor electrode in contact with the connection electrode, the light-transmissive semiconductor electrode being made of a semiconductor layer, and
a pad electrode in contact with a first portion of the uppermost surface of the light-transmissive semiconductor electrode, such that a second portion of the uppermost surface of the light-transmissive semiconductor electrode is exposed from the pad electrode; and
wherein the light-transmissive connection electrode is an ohmic electrode that includes:
a first ohmic electrode ohmically contacting the second semiconductor layer, and a second ohmic electrode bonded to the first ohmic electrode by surface activation bonding or atomic diffusion bonding, and ohmically contacting the semiconductor electrode, wherein both the first ohmic electrode and the second ohmic electrode are made of indium tin oxide.

16. The semiconductor light-emitting element according to claim 15, wherein the sapphire substrate has protrusions on a first semiconductor layer side thereof.

17. The semiconductor light-emitting element according to claim 15, wherein a thickness of the first ohmic electrode is greater than a thickness of the second ohmic electrode.

18. The semiconductor light-emitting element according to claim 15, wherein the first semiconductor layer, the second semiconductor layer, and the semiconductor electrode each comprise a nitride semiconductor.

19. The semiconductor light-emitting element according to claim 18, wherein the semiconductor electrode comprises GaN or AlGaN.

20. The semiconductor light-emitting element according to claim 19, wherein the semiconductor electrode comprises GaN doped with an n-type impurity.

21. The semiconductor light-emitting element according to claim 20, wherein a concentration of the n-type impurity of the semiconductor electrode is in a range of $1\times10^{18}/cm^3$ to $1\times10^{19}/cm^3$.

22. The semiconductor light-emitting element according to claim 15, wherein a thickness of the semiconductor electrode is greater than a thickness of the light-transmissive connection electrode.

23. The semiconductor light-emitting element according to claim 15, wherein the semiconductor electrode has a thickness in a range of 2 μm to 200 μm.

24. The semiconductor light-emitting element according to claim 15, wherein the semiconductor electrode has a thickness in a range of 4 μm to 10 μm.

25. The semiconductor light-emitting element according to claim 15, wherein a thickness of the first ohmic electrode and a thickness of the second ohmic electrode is in a range of 1 nm to 30 nm.

26. The semiconductor light emitting element according to claim 15, wherein the second ohmic electrode is bonded to the first ohmic electrode by atomic diffusion bonding, such that an atomic diffusion layer is located between the first ohmic electrode and the second ohmic electrode.

27. The semiconductor light-emitting element according to claim 26, wherein the atomic diffusion layer is an Au layer.

28. The semiconductor light-emitting element according to claim 27, wherein the Au layer has a thickness in a range of 0.1 μm to 0.4 μm.

29. The semiconductor light emitting element according to claim 15, wherein the light-transmissive semiconductor electrode has a single planar uppermost surface that extends from a first overall end of the light-transmissive semiconductor electrode to a second overall end of the light-transmissive semiconductor electrode, and wherein an end surface of the second semiconductor layer is flush with an end surface of the light-transmissive semiconductor electrode in a cross-sectional view of the semiconductor light-emitting element.

* * * * *